US012581965B2

(12) United States Patent
Lin et al.

(10) Patent No.: US 12,581,965 B2
(45) Date of Patent: Mar. 17, 2026

(54) PACKAGING STRUCTURE AND MANUFACTURING METHOD THEREOF

(71) Applicant: JCET GROUP CO., LTD., Wuxi City (CN)

(72) Inventors: Yaojian Lin, Wuxi City (CN); Danfeng Yang, Wuxi City (CN); Chen Xu, Wuxi City (CN); Shuo Liu, Wuxi City (CN); Chenye He, Wuxi City (CN); Shasha Zhou, Wuxi City (CN); Xueqing Chen, Wuxi City (CN)

(73) Assignee: JCET GROUP CO., LTD., Wuxi City (CN)

( * ) Notice: Subject to any disclaimer, the term of this patent is extended or adjusted under 35 U.S.C. 154(b) by 625 days.

(21) Appl. No.: 18/077,149

(22) Filed: Dec. 7, 2022

(65) Prior Publication Data

US 2023/0187366 A1     Jun. 15, 2023

(30) Foreign Application Priority Data

Dec. 9, 2021     (CN) .......................... 202111496572.X

(51) Int. Cl.
*H10W 70/60*          (2026.01)
*H10W 70/05*          (2026.01)
(Continued)

(52) U.S. Cl.
CPC .......... *H10W 70/611* (2026.01); *H10W 70/05* (2026.01); *H10W 70/093* (2026.01);
(Continued)

(58) Field of Classification Search
CPC ............. H01L 23/5385; H01L 21/4853; H01L 21/4857; H01L 21/486; H01L 21/563;
(Continued)

(56) References Cited

U.S. PATENT DOCUMENTS

2005/0151249 A1     7/2005   Eckstein et al.
2017/0062383 A1*    3/2017   Yee .......................... H01L 24/20
(Continued)

FOREIGN PATENT DOCUMENTS

CN          112038330 A      12/2020
CN          112435996 A       3/2021
(Continued)

*Primary Examiner* — Evan G Clinton
(74) *Attorney, Agent, or Firm* — MUNCY, GEISSLER, OLDS & LOWE, P.C.

(57)          ABSTRACT

The present invention provides a packaging structure and a manufacturing method thereof. The packaging structure includes a lower package, an upper package and a first redistribution stack layer disposed between the lower package and the upper package, wherein the first redistribution stack layer is electrically connected to the lower package and the upper package; the lower package includes a prefabricated substrate and a first plastic packaging layer surrounding the periphery of the prefabricated substrate; and the minimum line width/line spacing of the first redistribution stack layer is less than the minimum line width/line spacing of the prefabricated substrate. The lower package includes the prefabricated substrate and the first redistribution stack layer is disposed above the prefabricated substrate and has the minimum line width/line spacing less than that of the prefabricated substrate, so that more chips and/or device packages are integrated in the packaging structure.

14 Claims, 9 Drawing Sheets

100

(51) Int. Cl.

| | |
|---|---|
| *H10W 70/65* | (2026.01) |
| *H10W 70/685* | (2026.01) |
| *H10W 74/01* | (2026.01) |
| *H10W 74/10* | (2026.01) |
| *H10W 74/15* | (2026.01) |
| *H10W 74/47* | (2026.01) |
| *H10W 90/00* | (2026.01) |
| *H10W 72/00* | (2026.01) |
| *H10W 74/00* | (2026.01) |
| *H10W 90/20* | (2026.01) |

(52) U.S. Cl.

CPC ......... *H10W 70/095* (2026.01); *H10W 70/65* (2026.01); *H10W 70/685* (2026.01); *H10W 74/012* (2026.01); *H10W 74/117* (2026.01); *H10W 74/121* (2026.01); *H10W 74/15* (2026.01); *H10W 74/47* (2026.01); *H10W 90/00* (2026.01); *H10W 90/401* (2026.01); *H10W 70/60* (2026.01); *H10W 72/877* (2026.01); *H10W 74/00* (2026.01); *H10W 90/288* (2026.01); *H10W 90/701* (2026.01); *H10W 90/724* (2026.01); *H10W 90/734* (2026.01)

(58) Field of Classification Search

CPC ............... H01L 23/293; H01L 23/3128; H01L 23/3135; H01L 23/49822; H01L 23/49833; H01L 23/49838; H01L 23/5386; H01L 24/16; H01L 24/32; H01L 24/73; H01L 25/0655; H01L 25/105; H01L 25/162; H01L 25/165; H01L 23/49816; H01L 2224/16227; H01L 2224/16235; H01L 2224/16238; H01L 2224/32225; H01L 2224/73204; H01L 2224/73253; H01L 2225/1023; H01L 2225/1041; H01L 2225/107; H01L 2225/1094; H01L 2924/182; H01L 2924/19011; H01L 2924/19041; H01L 25/0652; H01L 2225/06548; H01L 24/24; H01L 23/49827; H01L 23/147; H01L 24/19; H01L 24/20; H01L 24/82; H01L 2225/06524; H01L 23/5389; H01L 25/16; H01L 25/50; H01L 2224/16225; H01L 2224/18; H01L 2924/18161; H10W 70/611; H10W 70/05; H10W 70/093; H10W 70/095; H10W 70/65; H10W 70/685; H10W 74/012; H10W 74/117; H10W 74/121; H10W 74/15; H10W 74/47; H10W 90/00; H10W 90/401; H10W 70/60; H10W 72/877; H10W 74/00; H10W 90/288; H10W 90/701; H10W 90/724; H10W 90/734

See application file for complete search history.

(56)  References Cited

U.S. PATENT DOCUMENTS

| | | | |
|---|---|---|---|
| 2021/0375785 A1* | 12/2021 | Wu | ..................... H01L 21/4857 |
| 2022/0028801 A1* | 1/2022 | Tien | ..................... H01L 21/568 |

FOREIGN PATENT DOCUMENTS

| | | |
|---|---|---|
| JP | 2000124352 A | 4/2000 |
| KR | 20210073956 A | 6/2021 |

* cited by examiner

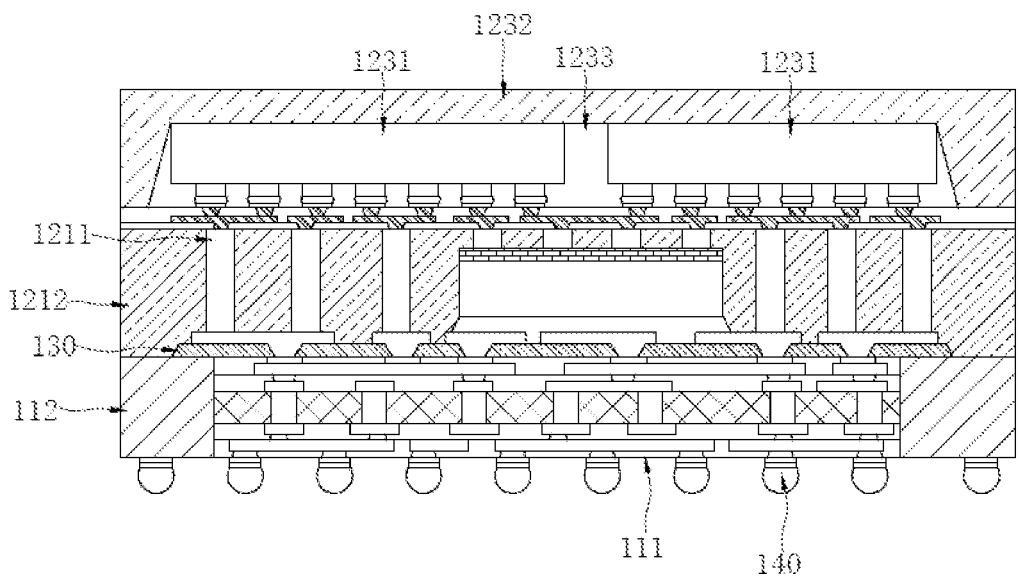

Forming a lower package by providing a prefabricated substrate and plastic-packaging the prefabricated substrate to form a first plastic packaging layer Forming a first redistribution stack layer on one side of the lower package, wherein the first redistribution stack layer and the prefabricated substrate are electrically connected Acquiring a packaging structure by packaging an upper package above the first redistribution stack layer

FIG. 24

PACKAGING STRUCTURE AND MANUFACTURING METHOD THEREOF

TECHNICAL FIELD

The present invention belongs to the field of semiconductor packaging technologies, and in particular relates to a packaging structure and a manufacturing method thereof.

BACKGROUND

With the rapid development of high-speed computation and artificial intelligence, higher requirements are put forward on packaging of semiconductor chips and packages, especially for packaging substrates, where laminated substrates are usually required to have smaller line width/line spacing and better control of voltage drop. However, the line width/line spacing of the traditional laminated substrate wiring is usually about 15 μm/15 μm, which becomes increasingly incompetent to satisfy high-density packaging requirements for electronic components applied to high-speed computation and artificial intelligence.

In addition, the traditional laminated substrate technology is faced with greater challenges in the following aspects: 1) supply of stacked dielectric materials; 2) manufacturing cycle; and 3) wiring with line width/line spacing being less than 10 μm and the yield control of buried chips.

Therefore, it is necessary to propose a new packaging structure and a manufacturing method thereof to overcome the difficulty that the traditional laminated substrate cannot meet the requirement of high-density packaging due to the larger line width/line spacing of wiring.

SUMMARY

The present invention provides a packaging structure and a manufacturing method thereof, so that a prefabricated substrate having the large line width/line spacing can meet the requirements of high-density integration.

To solve the above problem, the technical solution of the present invention provides a packaging structure. The packaging structure includes: a lower package, an upper package disposed above the lower package, and a first redistribution stack layer disposed between the lower package and the upper package, wherein the first redistribution stack layer is electrically connected to the lower package and the upper package; the lower package includes a prefabricated substrate and a first plastic packaging layer surrounding the periphery of the prefabricated substrate; the upper package includes an interconnect chip packaging layer disposed above the first redistribution stack layer, a second redistribution stack layer disposed above the interconnect chip packaging layer, and a packaging layer with a chip and/or a device package, which is disposed above the second redistribution stack layer; the interconnect chip packaging layer includes a plurality of metal conductive pillars, and a second plastic packaging layer, which plastic-packages the plurality of metal conductive pillars above the first redistribution stack layer, and the first redistribution stack layer and the second redistribution stack layer are electrically connected through the plurality of metal conductive pillars; and the minimum line width/line spacing of the first redistribution stack layer is less than the minimum line width/line spacing of the prefabricated substrate.

As an alternative technical solution, the interconnect chip packaging layer further includes an interconnect chip buried in the second plastic packaging layer, and the interconnect chip is upright-bonded above the first redistribution stack layer; and an interconnect redistribution stack layer is disposed on a surface of a side, facing the second redistribution stack layer, of the interconnect chip, the minimum line width/line spacing of the interconnect redistribution stack layer is less than 2 and the interconnect redistribution stack layer includes at least one capacitor.

As an alternative technical solution, both the minimum line width/line spacing of the first redistribution stack layer and the minimum line width/line spacing of the second redistribution stack layer are less than 10 μm.

As an alternative technical solution, in the packaging layer with the chip and/or the device package, the chip and/or the device package are/is flip-bonded above the second redistribution stack layer and is electrically connected to the second redistribution stack layer; the packaging layer with the chip and/or the device package further includes a third plastic packaging layer which plastic-packages the chip and/or the device package above the second redistribution stack layer; and a back surface of the chip and/or a back surface of the device package are exposed from the third plastic packaging layer respectively.

As an alternative technical solution, a plurality of metal bumps or solder balls are further disposed on a back side of the prefabricated substrate away from the first redistribution stack layer, the plurality of metal bumps or solder balls being electrically connected to a conductive layer in the prefabricated substrate.

As an alternative technical solution, the packaging structure further includes at least one first silicon capacitor chip and/or at least one second silicon capacitor chip, wherein the at least one first silicon capacitor chip is buried in a first base material layer of the prefabricated substrate, and is electrically connected to the first redistribution stack layer directly; and the at least one second silicon capacitor chip is buried in the second plastic packaging layer, and is electrically connected to the first redistribution stack layer or the second redistribution stack layer directly.

As an alternative technical solution, the lower package further includes a first prefabricated redistribution stack layer and/or a second prefabricated redistribution stack layer; the prefabricated substrate includes a first surface and a second surface which are opposite to each other, the first prefabricated redistribution stack layer being disposed on one side of the first surface and the second prefabricated redistribution stack layer being disposed on one side of the second surface; the first plastic packaging layer is disposed around the periphery of the first prefabricated redistribution stack layer and/or the second prefabricated redistribution stack layer that forms a substrate unit with the prefabricated substrate; and both the minimum line width/line spacing of the first prefabricated redistribution stack layer and the minimum line width/line spacing of the second prefabricated redistribution stack layer are less than 10 μm.

As an alternative technical solution, the packaging structure further includes a passive element which is buried in the first plastic packaging layer and is electrically connected to the first redistribution stack layer.

As an alternative technical solution, the packaging structure further includes a heat dissipation device disposed on an edge and/or at a corner of the first redistribution stack layer.

As an alternative technical solution, the lower package further includes: a third prefabricated redistribution stack layer and a prefabricated interconnect chip packaging layer which are disposed between the prefabricated substrate and the first redistribution stack layer, wherein the third prefabricated redistribution stack layer is disposed above the prefabricated substrate, and the prefabricated interconnect chip packaging layer is disposed above the third prefabricated redistribution stack layer; the prefabricated interconnect chip packaging layer includes a plurality of prefabricated metal conductive pillars, a prefabricated interconnect chip, and a fourth plastic packaging layer which plastic-packages the plurality of prefabricated metal conductive pillars and the prefabricated interconnect chip above the third prefabricated redistribution stack layer; the first redistribution stack layer and the third prefabricated redistribution stack layer are electrically connected through the plurality of prefabricated metal conductive pillars; and the prefabricated substrate, the first plastic packaging layer, the third prefabricated redistribution stack layer, the prefabricated interconnect chip packaging layer and the first redistribution stack layer together constitute a prefabricated packaging substrate.

The present invention further provides a manufacturing method of a packaging structure. The manufacturing method includes: forming a lower package by providing a prefabricated substrate and plastic-packaging the prefabricated substrate to form a first plastic packaging layer; forming a first redistribution stack layer on one side of the lower package, wherein the first redistribution stack layer and the prefabricated substrate are electrically connected; and acquiring the packaging structure by packaging an upper package above the first redistribution stack layer, wherein the minimum line width/line spacing of the first redistribution stack layer is less than the minimum line width/line spacing of the prefabricated substrate.

As an alternative technical solution, the step of forming the lower package by providing the prefabricated substrate and plastic-packaging the prefabricated substrate to form the first plastic packaging layer includes: providing a carrier board which is temporarily bonded to a plurality of prefabricated substrates that are cut into single grains in advance; forming the first plastic packaging layer by coating the carrier board with a plastic packaging material to plastic-package the prefabricated substrate; and acquiring the lower package by separating the first plastic packaging layer and the prefabricated substrate from the carrier board.

As an alternative technical solution, the step of acquiring the packaging structure by packaging the upper package above the first redistribution stack layer includes: forming a plurality of metal conductive pillars above the first redistribution stack layer; bonding an interconnect chip above the first redistribution stack layer, wherein an upper portion of the interconnect chip away from the first redistribution stack layer is provided with an interconnect redistribution stack layer and a plurality of conductive bumps; forming a second plastic packaging layer by plastic-packaging the plurality of metal conductive pillars and the interconnect chip; thinning the second plastic packaging layer to expose the plurality of metal conductive pillars and the plurality of conductive bumps; forming a second redistribution stack layer above the second plastic packaging layer, wherein the second redistribution stack layer is electrically connected to the plurality of metal conductive pillars and the plurality of conductive bumps; flip-bonding a chip and/or a device package above the second redistribution stack; and forming a third plastic encapsulation layer by plastic-packaging the chip and/or the device package.

As an alternative technical solution, the manufacturing method further includes: thinning a side of the first plastic packaging layer away from the first redistribution stack layer to expose a conductive layer on a back side of the prefabricated substrate; implanting solder balls or metal bumps onto the conductive layer, wherein the solder balls or metal bumps are electrically connected to the conductive layer; and thinning the third plastic packaging layer to expose a back side of the chip and/or a back side of the device package.

Compared with the prior art, the packaging structure and the manufacturing method according to the present invention have the advantages as follows. The lower package of the packaging structure includes the prefabricated substrate and the first redistribution stack layer is disposed above the prefabricated substrate and has the minimum line width/line spacing less than that of the prefabricated substrate, so that more chips and/or device packages are integrated in the packaging structure by using the first redistribution stack layer having the smaller line width/line spacing. In addition, the upper package of the packaging structure includes the metal conductive pillars for vertical interconnection, the second plastic packaging layer and the second redistribution stack layer, wherein the second plastic packaging layer plastic-packages the metal conductive pillars, the second redistribution stack layer is disposed above the second plastic packaging layer, the first redistribution stack layer and the second redistribution stack layer are vertically interconnected through the metal conductive pillars, and a capacitor and an inductor formed between the first redistribution stack layer and the second redistribution stack layer which are spaced apart vertically can serve as filters or electrostatic protection structures.

The following describes the present invention in detail with reference to the accompanying drawings and specific embodiments, but is not intended as a limitation of the present invention.

BRIEF DESCRIPTION OF THE DRAWINGS

To describe embodiments of the present invention or the technical solutions in the prior art more clearly, the following will briefly introduce the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

FIG. 23 is a schematic sectional view when the third plastic packaging layer is thinned such that a back surface of the chip and/or the device package is exposed; and FIG. 24 is a flowchart of a manufacturing method of a packaging structure according to the present invention.

DETAILED DESCRIPTION

In order to make the purposes, technical solutions and advantages of the present invention clearer, the present invention is further illustrated in detail below with reference to embodiments and the accompanying drawings. It should be understood that the specific embodiments described herein are only intended to explain the present invention instead of limiting the present invention.

In the description of the present invention, it should be noted that the orientation or positional relationship indicated by the terms such as "center", "upper", "lower", "left", "right", "vertical", "horizontal", "inner", and "outer" is the orientation or positional relationship shown on the basis of the drawings, only for the purposes of the ease in describing the present disclosure and simplification of its descriptions, but not indicating or implying that the specified device or element has to be specifically located, and structured and operated in a specific direction, and therefore, should not be understood as limitations to the present invention.

One object of the present invention is to provide a packaging structure. The packaging structure includes a lower package, an upper package and a first redistribution stack layer disposed between the lower package and the upper package. The lower package and the upper package are electrically connected through the first redistribution stack layer. The lower package includes a prefabricated substrate and a first plastic packaging layer surrounding the periphery of the prefabricated substrate; and the line width/line spacing of the first redistribution stack layer is less than the line width/line spacing of the prefabricated substrate for realizing integration of more chips or device packages on the first redistribution stack layer.

In addition, the upper package includes metal conductive pillars for vertical interconnection, a second plastic packaging layer and a second redistribution stack layer. The metal conductive pillars plastic-packaged by the second plastic packaging layer, the second redistribution stack layer is disposed above the second plastic packaging layer, the first redistribution stack layer and the second redistribution stack layer are vertically interconnected through the metal conductive pillars, and a capacitor and an inductor formed between the first redistribution stack layer and the second redistribution stack layer which are spaced apart vertically may serve as filters or electrostatic protection structures.

The packaging structure according to the present invention will be described in detail below in combination with FIG. 1 to FIG. 6.

Figure 1:
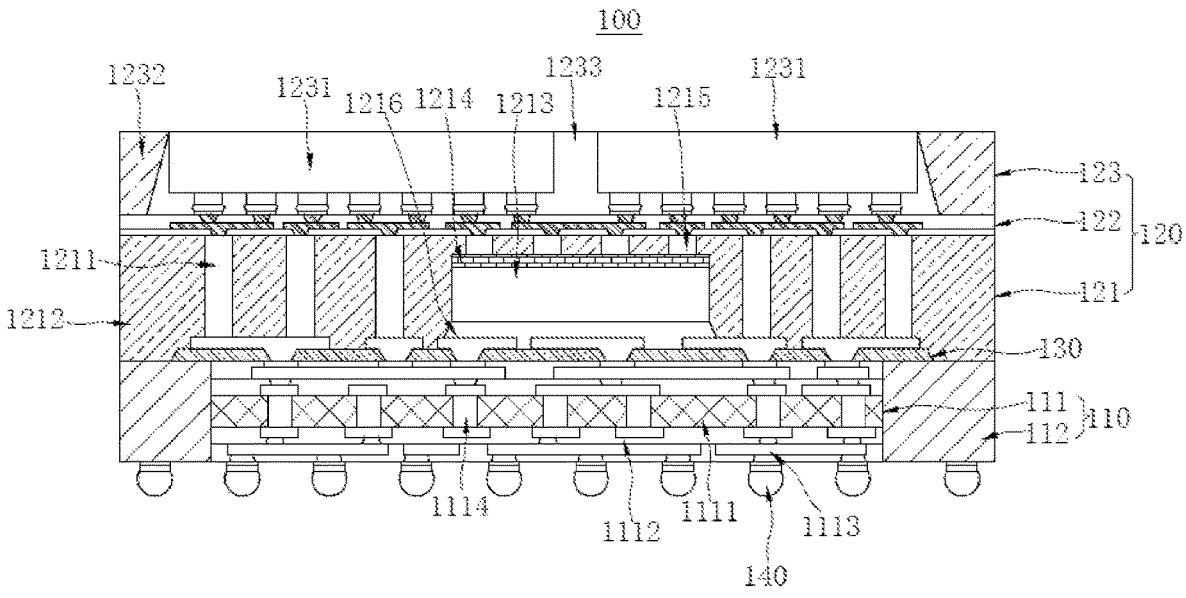
FIG. 1 is a schematic sectional view of a packaging structure according to a first embodiment of the present invention.

As shown in FIG. 1, a packaging structure 100 is provided in a first embodiment of the present invention. The packaging structure 100 includes a lower package 110, an upper package 120, and a first redistribution stack layer 130 disposed between the lower package 110 and the upper package 120. The first redistribution stack layer 130 is electrically connected to the lower package 110 and the upper package 120. The lower package 110 includes a prefabricated substrate 111 and a first plastic packaging layer 112 surrounding the prefabricated substrate 111. The upper package 120 includes an interconnect chip packaging layer 121 disposed above the first redistribution stack layer 130, a second redistribution stack layer 122 disposed above the interconnect chip packaging layer 121, and a packaging layer 123 with a chip and/or a device package, which is disposed above the second redistribution stack layer 122. The interconnect chip packaging layer includes a plurality of metal conductive pillars 1211, and a second plastic packaging layer 1212, which plastic-packages the plurality of metal conductive pillars 1211 above the first redistribution stack layer 130, and the first redistribution stack layer 130 and the second redistribution stack layer 122 are electrically connected through the plurality of metal conductive pillars 1211. The minimum line width/line spacing of the first redistribution stack layer 130 is less than the minimum line width/line spacing of the prefabricated substrate 111.

In a preferred embodiment, both the minimum line width/line spacing of first redistribution stack layer 130 and the minimum line width/line spacing of the second redistribution stack layer 122 are less than 10 μm.

As shown in FIG. 1, the interconnect chip packaging layer 121 further includes an interconnect chip 1213 embedded in the second plastic packaging layer 1212, which is upright-bonded above the first redistribution stack layer 130. Preferably, an adhesive layer 1216 is disposed between the interconnect chip 1213 and the first redistribution stack layer 130, and contributes to stable bonding of the interconnect chip 1213 above the first redistribution stack layer 130, thereby preventing the interconnect chip 1213 from being negatively affected by moisture, vibration and other harmful operating environment.

An interconnect distribution stack layer 1214 is disposed on a surface of a side, facing the second distribution stack layer 122, of the interconnect chip 1213, the minimum line width/line spacing of the interconnect distribution stack layer 1214 is less than 2 μm, and the interconnect redistribution stack layer 1214 includes at least one capacitor. The interconnect redistribution stack layer 1214 is, for example, made in a wafer-level or panel-level packaging process of the interconnect chip 1213.

In addition, metal bumps 1215 are disposed above the interconnect redistribution stack layer 1214, and is electrically connected to the second redistribution stack layer 122.

In this embodiment, the interconnect redistribution stack layer 1214 is embedded in the second plastic packaging layer 1212, and the first redistribution stack layer 130 and the second redistribution stack layer 122 are located on two opposite sides of the second plastic packaging layer 1212 respectively. Therefore, a capacitor and an inductor formed between any two of the first redistribution stack layer 130, the interconnect redistribution stack layer 1214 and the second redistribution stack layer 122 may serve as a filter or an electrostatic protection structure.

With continued reference to FIG. 1, in the packaging layer 123 with the chip and/or the device package 1231, the chip and/or the device package 1231 is flip-bonded above the second redistribution stack layer 122 and electrically connected to the second redistribution stack layer 122. The chip and/or the device package 1231 is first filled with a bottom filler layer 1233, which contributes to stable bonding of the chip and/or the device package 1231 above the second redistribution stack layer 122, thereby preventing the chip and/or the device package 1231 from being negatively affected by moisture, vibration and other harmful operating environment. A third plastic packaging layer 1232 is then formed above the second redistribution stack layer 122. The third plastic packaging layer 1232 is disposed around the periphery of the chip and/or the device package 1231, so that a back side of the chip and/or the device package 1231 is exposed from a front side of the third plastic packaging layer 1232. The front side of the third plastic packaging layer 1232 is, for example, a side away from the second redistribution stack layer 122.

In this embodiment, the upper package 120 is, for example, made in a wafer-level or panel-level packaging above the plastic-packaged prefabricated substrate 111, but is not limited to this. In packaging structures provided in fourth to sixth embodiments following this embodiment, the upper package may be a pre-packaged separate unit. After the prefabricated substrate is plastic-packaged and then reconstructed with the first redistribution stack layer, the two separate units are bonded to each other to achieve electrical connection.

With continued reference to FIG. 1, the prefabricated substrate 111 may be a traditional multilayer laminated substrate, and the line width/line spacing of the wiring is greater than 10 μm. The prefabricated substrate 111 includes, for example, a first base material layer 1111, first dielectric layers 1112, conductive layers 1113 and vias 1114. The first dielectric layers 1112 and the conductive layers 1113 are alternately disposed on each of two opposite sides of the first base material layer 1111 and the vias 1114 enable the electrical connection between the conductive layers 1113.

Each of the first base material layer 1111 and the first dielectric layer 1112 is, for example, selected from at least one of a built-up film, polyimide, bismaleimide triazine (BT) resin, epoxy resin, polyurethane, benzocyclobutene (BCB), high-density polyethylene (HDPE), and reinforced glass fiber or a combination thereof. The conductive layer 1112 is formed of a conductive material such as copper. The first dielectric layers 1112 and the conductive layers 1113 are disposed alternatively.

In this embodiment, the back side of the prefabricated substrate 111 is exposed, and a plurality of metal bumps or solder balls 140 are disposed on the back side of the prefabricated substrate 111 and electrically connected to the conductive layer 1113 inside the prefabricated substrate 111.

Figure 2:
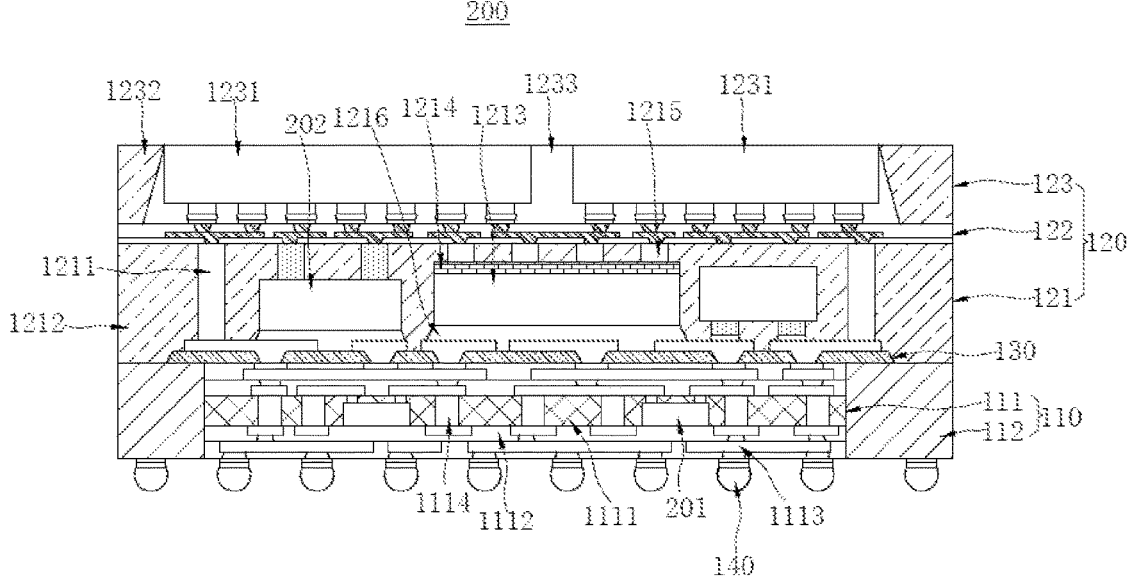
FIG. 2 is a schematic sectional view of a packaging structure according to a second embodiment of the present invention.

As shown in FIG. 2, a packaging structure 200 is further provided in a second embodiment of the present invention and is different from the packaging structure 100 in that the packaging structure 200 includes at least one first silicon capacitor chip and at least one second silicon capacitor chip for decoupling to control voltage drop or electrostatic protection.

The same signs in the packaging structure 200 and the packaging structure 100 represent the same elements which have similar functions and thus will not be repeated.

As shown in FIG. 2, the number of the at least one first silicon capacitors 201 is two, and the two first silicon capacitors 201 are both buried in the first base material layer 1111, and are electrically connected to the first redistribution stack layer 130 directly through the conductive layer 1113. The number of the at least one second silicon capacitors 202 is two and the two second silicon capacitors 202 are both buried in the second plastic packaging layer 1212. One of the two second silicon capacitors 202 is electrically connected to the first redistribution stack layer 130, and the other of the two second silicon capacitors 202 is electrically connected to the second redistribution stack layer 122 directly.

It should be noted that in other embodiments of the present invention, the packaging structure may only include at least one first silicon capacitor buried in the first base material layer of a prefabricated substrate, or only include at least one second silicon capacitor buried in the second plastic packaging layer.

In other words, the packaging structure according to the present invention includes at least one first silicon capacitor chip and/or at least one second silicon capacitor chip. The at least one first silicon capacitor chip is buried in the first base material layer of the prefabricated substrate, and is electrically connected to the first redistribution stack layer directly; and the at least one second silicon capacitor chip is buried in the second plastic packaging layer, and is electrically connected to the first redistribution stack layer or the second redistribution stack layer directly.

Figure 3:
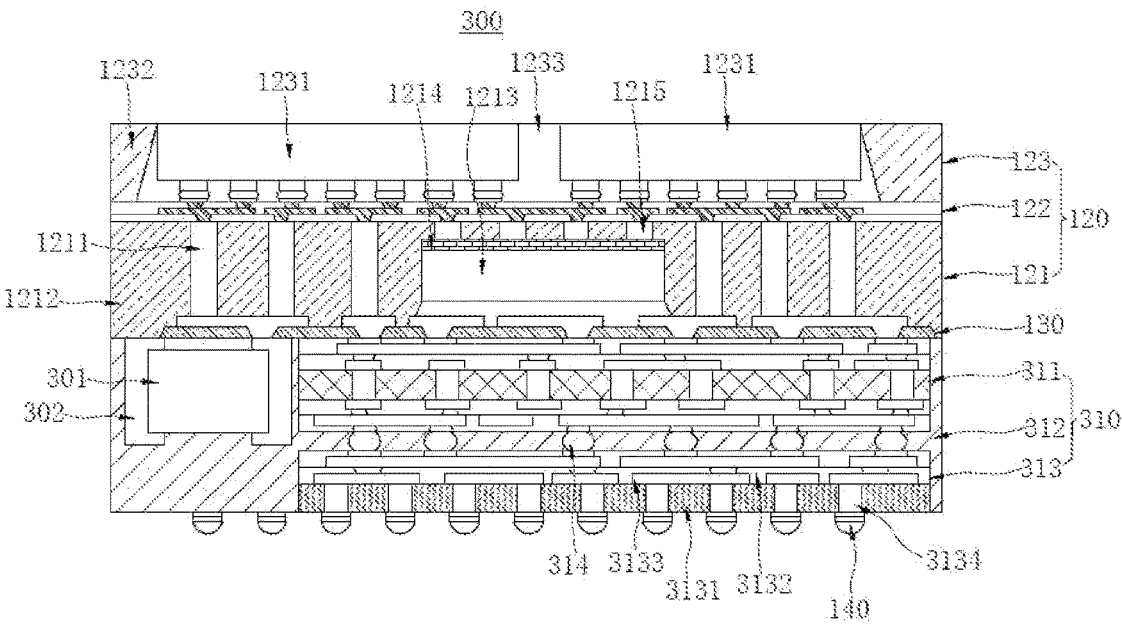
FIG. 3 is a schematic sectional view of a packaging structure according to a third embodiment of the present invention.

As shown in FIG. 3, a packaging structure 300 is further provided in a third embodiment of the present invention and is different from the packaging structure 100 in that in the packaging structure 300, a lower package 310 further includes a first prefabricated redistribution stack layer 313 disposed below a prefabricated substrate 311.

The same signs in the packaging structure 300 and the packaging structure 100 represent the same element, which have similar functions and thus will not be repeated. In addition, the structure of the prefabricated substrate 311 is similar to that of the prefabricated substrate 111, and may refer to the description of the prefabricated substrate 111 in FIG. 1.

As shown in FIG. 3, the lower package 310 includes the prefabricated substrate 311 and the first prefabricated redistribution stack layer 313 disposed below the prefabricated substrate 311. Preferably, a conductive member 314 is disposed between the prefabricated substrate 311 and the first prefabricated redistribution stack layer 313, which contributes to the electrical connection between the prefabricated substrate 311 and the first prefabricated redistribution stack layer 313.

In this embodiment, a first plastic packaging layer 312 is disposed around the peripheries of the prefabricated substrate 311 and the first prefabricated redistribution stack layer 313, and a part of the first plastic packaging layer 312 is filled between the prefabricated substrate 311 and the first prefabricated redistribution stack layer 313. As shown in FIG. 3, the size of the prefabricated substrate 311 is the same as that of the first prefabricated redistribution stack layer 313, but is not limited to this. In other embodiments of the present invention, the size of the prefabricated substrate is different from that of the first prefabricated redistribution stack layer.

Since in the packaging structure 300, the prefabricated substrate 311 and the first prefabricated redistribution stack layer 313 which are stacked are used, the thickness of the first plastic packaging layer 312 is appropriately increased. Therefore, a passive element 301 having a larger size is placed on the first plastic packaging layer 312, and a coating layer 302 is disposed on an outer side of the passive element 301, and enables the electrical connection between the passive element 301 and a first redistribution stack layer 130.

In a preferred embodiment, the minimum line width/line spacing of the first prefabricated redistribution stack layer 313 is less than 10 μm.

As shown in FIG. 3, the first prefabricated redistribution stack layer 313 includes a second base material layer 3131, second dielectric layers 3132, conductive layers 3133 and vias 3134. The conductive layers 3133 and the second dielectric layers 3132 are alternately disposed, and the vias 3134 enable the electrical connection between the conductive layers 3131.

In a preferred embodiment, the second dielectric layers 3132 and the conductive layers 3133 are alternately stacked above (or on an inner side of) the second base material layer 3131. The second base material layer 3131 is the outermost layer, and has a higher modulus, a higher glass transition temperature, and a lower thermal expansion coefficient difference than the second dielectric layer 3132.

Figure 4:
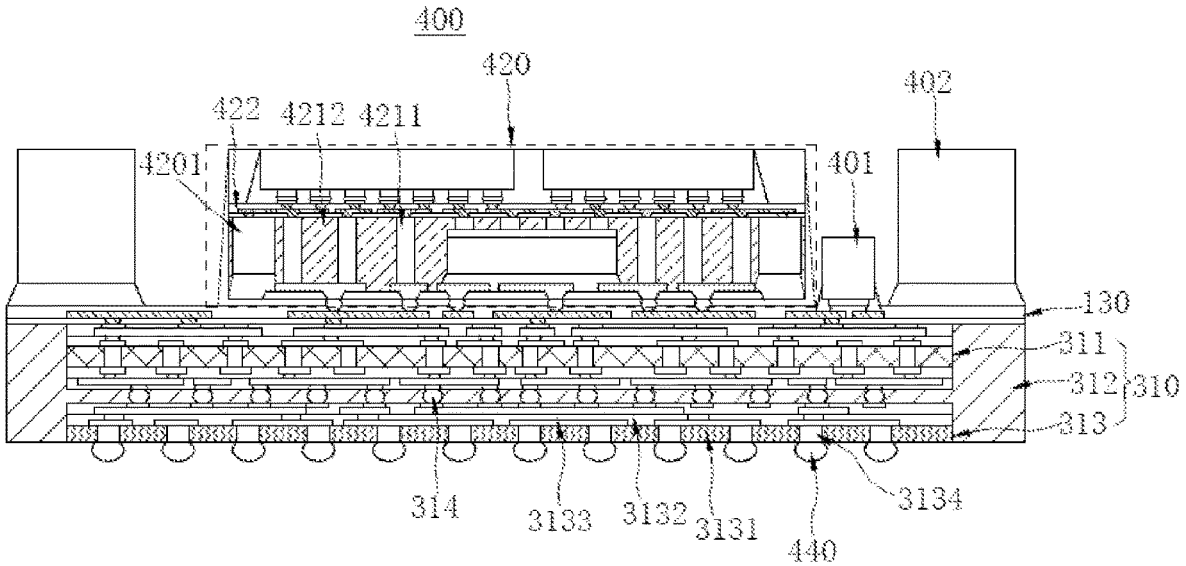
FIG. 4 is a schematic sectional view of a packaging structure according to a fourth embodiment of the present invention.

As shown in FIG. 4, a packaging structure 400 is further provided in the fourth embodiment of the present invention and is different from the packaging structure 300 as follows.

1) In the packaging structure 400, an upper package 420 is a prefabricated independent packaging unit, and the prefabricated upper package 420 may be made, for example, in wafer-level or panel-level packaging.

2) An internal structure of the prefabricated upper package 420 is different from an internal structure of the upper package 120 (as shown in FIG. 1 or FIG. 3) in that: a plurality of metal bumps or solder balls are disposed on one side of the prefabricated upper package 420 facing the first redistribution stack layer 130, and the plurality of metal bumps or solder balls are electrically connected to metal conductive pillars 4211 in an interconnect chip packaging layer.

3) The prefabricated upper package 420 is flip-bonded above the first redistribution stack layer 130, and is electrically connected to a metal layer of the first redistribution stack layer 130 through the plurality of metal bumps or solder balls.

4) The internal structure of the prefabricated upper package 420 is further different from the internal structure of the upper package 120 (as shown in FIG. 1 or FIG. 3) in that: in the interconnect chip packaging layer of the prefabricated upper package 420, a virtual element 4201 is buried in a side wall of the second plastic packaging layer 4212 and is configured to enhance heat dissipation and adjust the warpage of an edge and/or a corner of the upper package 420.

5) Other passive elements or package 401 and a heat dissipation structure 402 are disposed on an edge and/or at a corner of the first redistribution stack layer 130, and the heat dissipation structure 402 on the edge and/or at the corner of the first redistribution stack layer 130 may be configured to dissipate heat and improve the structural strength of the packaging structure 400, thereby avoiding warpage at the edge and/or corner of the packaging structure 400.

As shown in FIG. 4, the solder ball 440 located outside the second base material layer 3131 of the first prefabricated redistribution stack layer 313 in the packaging structure 400 is electrically connected to the via 3134 in the second base material layer 3131.

Figure 5:
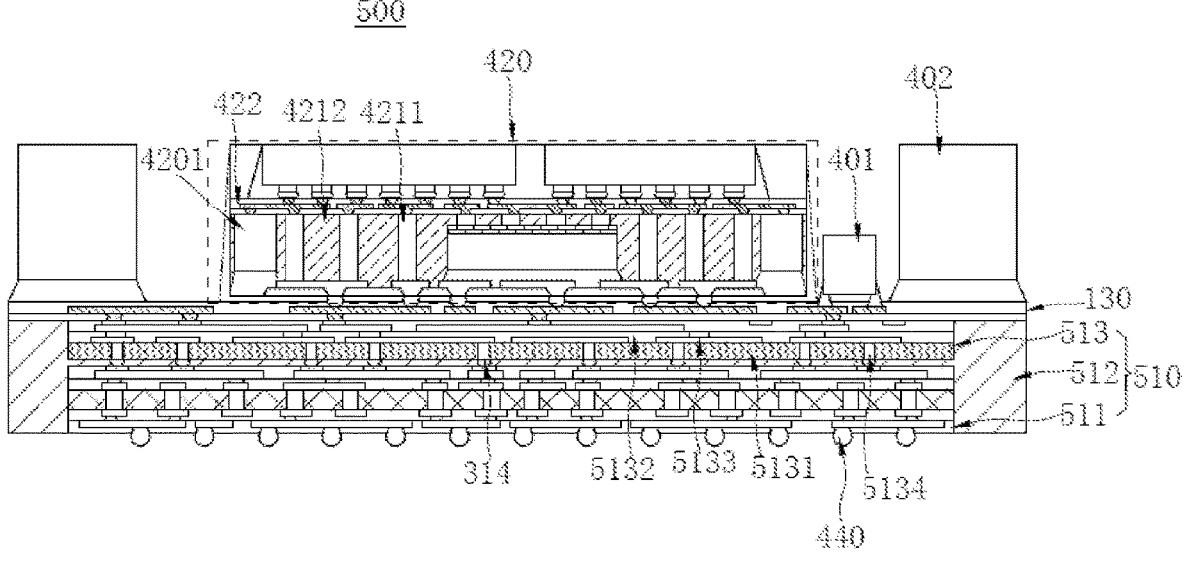
FIG. 5 is a schematic sectional view of a packaging structure according to a fifth embodiment of the present invention.

As shown in FIG. 5, a packaging structure 500 is further provided in a fifth embodiment of the present invention and is different from the packaging structure 400 in that in the packaging structure 500, a lower package 510 includes a prefabricated substrate 511 and a second prefabricated redistribution stack layer 513 disposed above the prefabricated substrate 511. The structure of the prefabricated substrate 511 is similar to that of the prefabricated substrate 311, and the structure of the second prefabricated redistribution stack layer 513 is similar to that of the first prefabricated redistribution stack layer 313.

In this embodiment, a third base material layer 5131 of the second prefabricated redistribution stack layer 513 is disposed close to the prefabricated substrate 511. Third dielectric layers 5132 and conductive layers 5133 of the second prefabricated redistribution stack layer 513 are alternately stacked above the third base material layer 5131. Respective conductive layers 5133 of the second prefabricated redistribution stack layer 513 are electrically connected through vias 5134.

In this embodiment, the first plastic packaging layer 512 plastic-packages the peripheries of the prefabricated substrate 511 and the second prefabricated redistribution stack layer 513.

Figure 6:
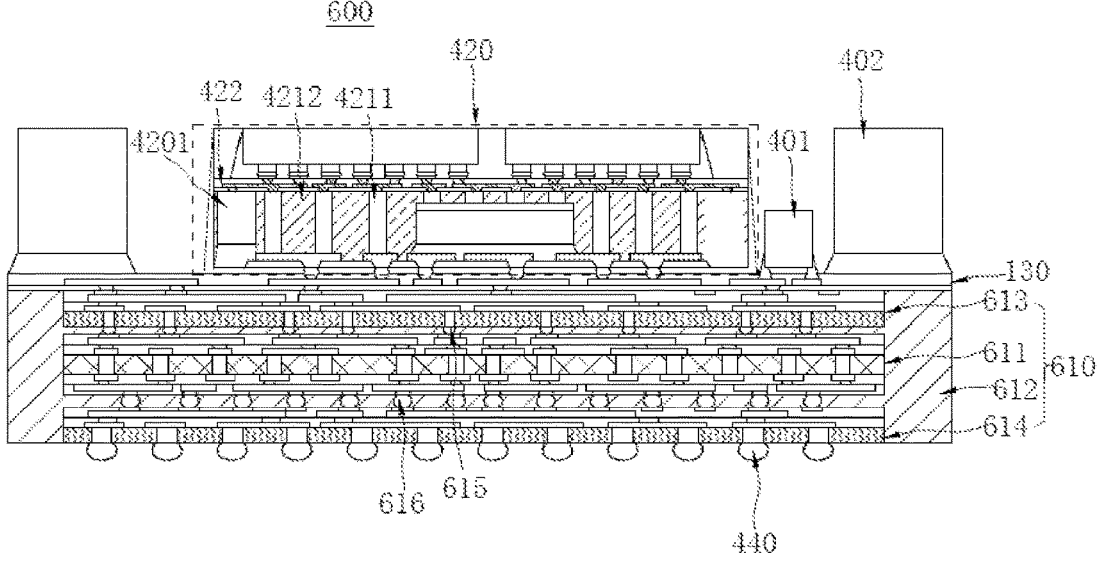
FIG. 6 is a schematic sectional view of a packaging structure according to a sixth embodiment of the present invention.

As shown in FIG. 6, a packaging structure 600 is further provided in the sixth embodiment of the present invention and is different from the packaging structures 400 and 500 in that, in the packaging structure 600, a lower package 610 includes a prefabricated substrate 611, a first prefabricated redistribution stack layer 613 disposed above the prefabricated substrate 611, and a second prefabricated redistribution stack layer 614 disposed below the prefabricated substrate 611. A first conductive member 615 and an optional bottom filler layer are disposed between the first prefabricated redistribution stack layer 613 and the prefabricated substrate 611. A second conductive member 616 and an optional bottom filler layer are disposed between the second prefabricated redistribution stack layer 614 and the prefabricated substrate 611.

The size of the first prefabricated redistribution stack layer 613 may be the same as or different from that of the second prefabricated redistribution stack layer 614.

In addition, the structure of the first prefabricated redistribution stack layer 613 may refer to the description of the first prefabricated redistribution stack layer 313 in FIG. 3, and the structure of the second prefabricated redistribution stack layer 614 may refer to the description of the second prefabricated redistribution stack layer 513 in FIG. 5.

In this embodiment, a first plastic packaging layer 612 plastic-packages the peripheries of the prefabricated substrate 611, the first prefabricated redistribution stack layer 613 and the second prefabricated redistribution stack layer 614.

It can be seen from the packaging structures 300, 400, 500 and 600 in FIG. 3 to FIG. 6 that the lower package may further include:

a first prefabricated redistribution stack layer and/or a second prefabricated redistribution stack layer. The prefabricated substrate includes a first surface and a second surface which are opposite to each other. The first prefabricated redistribution stack layer is disposed on one side of the first surface, and the second prefabricated redistribution stack layer is disposed on one side of the second surface. The first plastic packaging layer is disposed around the periphery of the first prefabricated redistribution stack layer and/or the second prefabricated redistribution stack layer that forms a substrate unit with the prefabricated substrate. Both the line width/line spacing of the first prefabricated redistribution stack layer and the minimum line width/line spacing of the second prefabricated redistribution stack layer are less than 10 μm.

Figure 7:
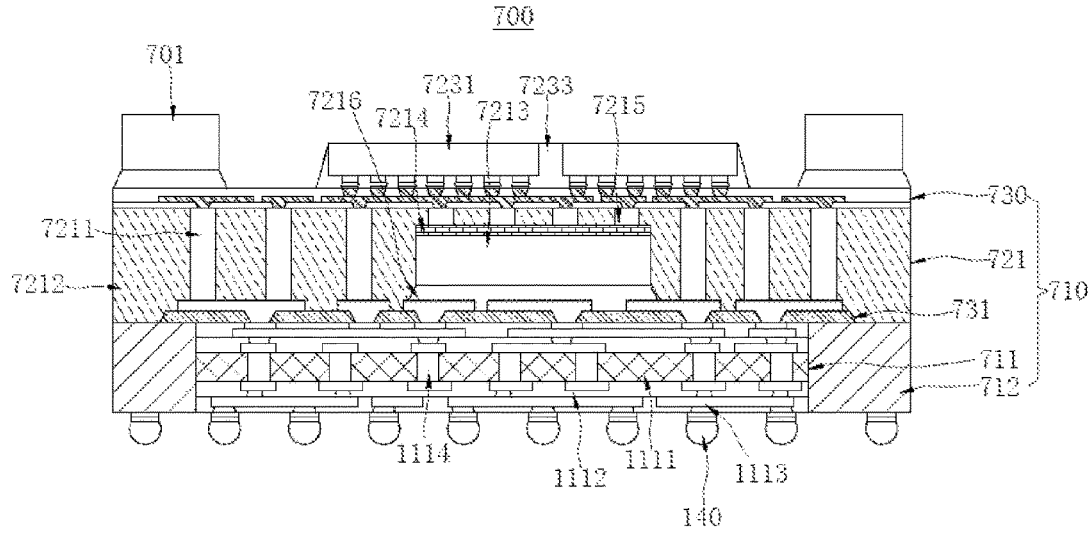
FIG. 7 is a schematic sectional view of a packaging structure according to a seventh embodiment of the present invention.

As shown in FIG. 7, a packaging structure 700 is further provided in a seventh embodiment of the present invention and is different from the packaging structure 100 in that in the packaging structure 700, a lower package 710 further includes a third prefabricated redistribution stack layer 731 and a prefabricated interconnect chip packaging layer 721 which are disposed between a prefabricated substrate 711 and a first redistribution stack layer 730. The third prefabricated redistribution stack layer 731 is disposed above the prefabricated substrate 711 and the prefabricated interconnect chip packaging layer 721 is disposed above the third prefabricated redistribution stack layer 731.

The prefabricated interconnect chip packaging layer 721 includes a plurality of prefabricated metal conductive pillars 7211, a prefabricated interconnect chip 7213 and a fourth plastic packaging layer 7212. The fourth plastic packaging layer 7212 plastic-packages the plurality of prefabricated metal conductive pillars 7211 and the prefabricated interconnect chip 7213 above the third prefabricated redistribution stack layer 731. The first redistribution stack layer 730 and the third prefabricated redistribution stack layer 731 are electrically connected through the plurality of prefabricated metal conductive pillars 7211.

In this embodiment, the prefabricated substrate 711, the first plastic packaging layer 712 surrounding the prefabricated substrate 711, the third prefabricated redistribution stack layer 731, the prefabricated interconnect chip packaging layer 721 and the first redistribution stack layer 730 together constitute the prefabricated packaging substrate. In other words, the lower package 710 may be used as an independent prefabricated packaging substrate. As an independent structure, the prefabricated packaging substrate may be made in a wafer-level or panel-level packaging process.

As shown in FIG. 7, on the independent lower package 710, a chip 7231 and/or a device package 7231 is flip-bonded above the first redistribution stack layer 730. A bottom filler layer 7233 is filled between the chip 7231 and/or the device package 7231 and the first redistribution stack layer 730. Optionally, a reinforcing structure 701 is disposed on an edge and/or at a corner of the first redistribution stack layer 730. The reinforcing structure 701 is made of, for example, a high thermal-conductivity material, which may reinforce the overall strength of the prefabricated packaging substrate on the one hand and enhance heat dissipation on the other hand.

In addition, the minimum line width/line spacing of the third prefabricated redistribution stack layer 731 is less than the minimum line width/line spacing of the prefabricated substrate 711. For example, the minimum line width/line spacing of the third prefabricated redistribution stack layer 731 is less than 10 μm.

The other same signs in FIG. 7 and FIG. 1 represent the same elements, which have similar functions, and thus will not be repeated.

Figure 8:
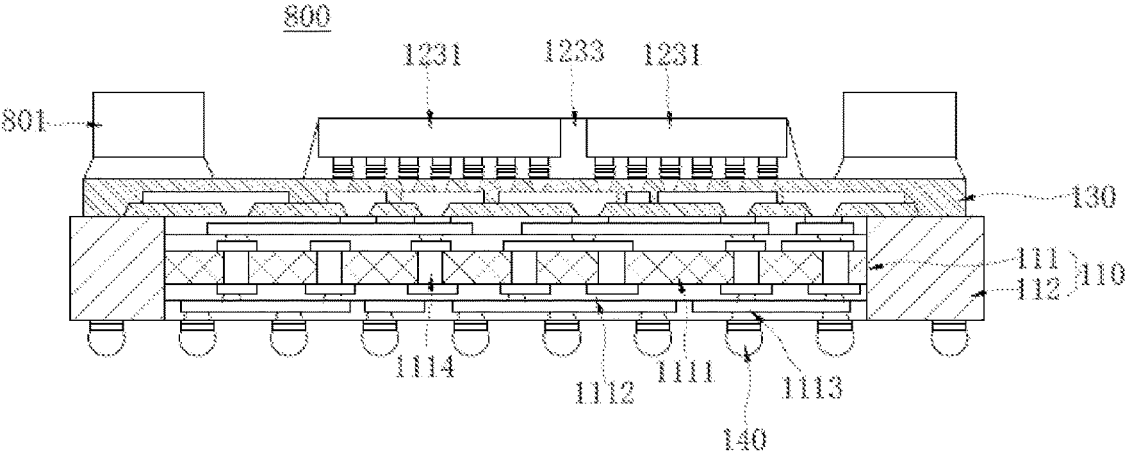
FIG. 8 is a schematic sectional view of a packaging structure according to an eighth embodiment of the present invention.

As shown in FIG. 8, a packaging structure 800 is further provided in an eighth embodiment of the present invention and is different from the packaging structure 100 in that in the packaging structure 800, the prefabricated substrate 111 is plastic-packaged by the first plastic packaging layer 112 to form the lower package 110, the first redistribution stack layer 130 is disposed above the lower package 110, and the chip 1231 and/or the device package 1231 is flip-mounted above the first redistribution stack layer 130 and is electrically connected to the first redistribution stack layer 130.

A bottom filler layer 1233 is filled between the chip 1231 and/or the device package 1231 and the first redistribution stack layer 130.

Optionally, a reinforcing structure 801 is disposed on an edge and/or at a corner of the first redistribution stack layer 130. The reinforcing structure 801 is, for example, made of a high-thermal-conductivity material, which may reinforce the overall strength of the packaging structure on the one hand and enhance heat dissipation on the other hand. Further, optionally, a plastic packaging material may be disposed above the first redistribution stack layer 130 to plastic-package the chip 1231 and/or the device package 1231 and the reinforcing structure 801.

The other same signs in FIG. 8 and FIG. 1 represent the same elements, which have similar functions, and thus will not be repeated.

As shown in FIG. 24, the present invention further provides a manufacturing method 2000 of a packaging structure. The manufacturing method of the packaging structure includes: forming a lower package by providing a prefabricated substrate and plastic-packaging the prefabricated substrate to form a first plastic packaging layer;

forming a first redistribution stack layer on one side of the lower package, wherein the first redistribution stack layer and the prefabricated substrate are electrically connected; and acquiring the packaging structure by packaging an upper package above the first redistribution stack layer, wherein the minimum line width/line spacing of the first redistribution stack layer is less than the minimum line width/line spacing of the prefabricated substrate.

In a preferred embodiment, the step of forming the lower package by providing the prefabricated substrate and plastic-packaging the prefabricated substrate to form the first plastic packaging layer includes:

providing a carrier board which is temporarily bonded to a plurality of prefabricated substrates that are cut into single grains in advance; forming the first plastic packaging layer by coating the carrier board with a plastic packaging material to plastic-package the prefabricated substrate; and acquiring the lower package by separating the first plastic packaging layer and the prefabricated substrate from the carrier board.

In a preferred embodiment, the step of acquiring the packaging structure by packaging the upper package above the first redistribution stack layer includes:

forming a plurality of metal conductive pillars above the first redistribution stack layer; bonding an interconnect chip above the first redistribution stack layer, wherein an upper portion of the interconnect chip away from the first redistribution stack layer is provided with an interconnect redistribution stack layer and a plurality of conductive bumps; forming a second plastic packaging layer by plastic-packaging the plurality of metal conductive pillars and the interconnect chip; thinning the second plastic packaging layer to expose the plurality of metal conductive pillars and the plurality of conductive bumps; forming a second redistribution stack layer above the second plastic packaging layer, wherein the second redistribution stack layer is electrically connected to the plurality of metal conductive pillars and the plurality of conductive bumps; flip-bonding a chip and/or a device package above the second redistribution stack layer; and forming a third plastic packaging layer by plastic-packaging the chip and/or the device package.

In a preferred embodiment, the manufacturing method 2000 further includes:

thinning a side of the first plastic packaging layer away from the first redistribution stack layer to expose a conductive layer on a back side of the prefabricated substrate; implanting solder balls or metal bumps onto the conductive layer, wherein the solder balls or metal bumps are electrically connected to the conductive layer; and thinning the third plastic packaging layer to expose a back side of the chip and/or a back side of the device package.

Specific manufacturing processes of respective steps in the manufacturing method 2000 above will be described below by taking the packaging structure 100 as an example.

Figure 9:
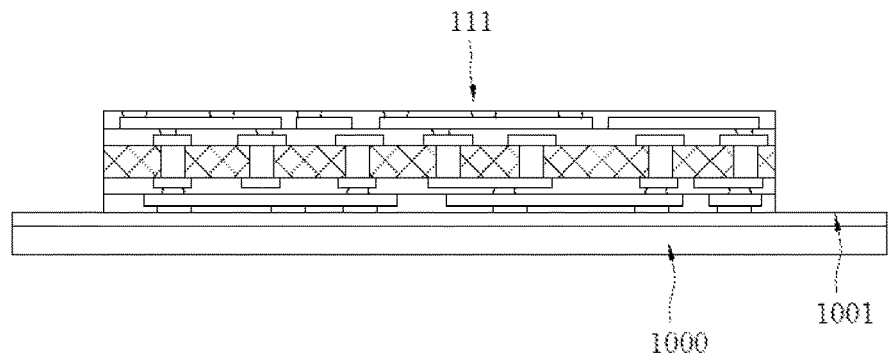
FIG. 9 is a schematic sectional view after a prefabricated substrate and a carrier board are temporarily bonded.
Figure 10:
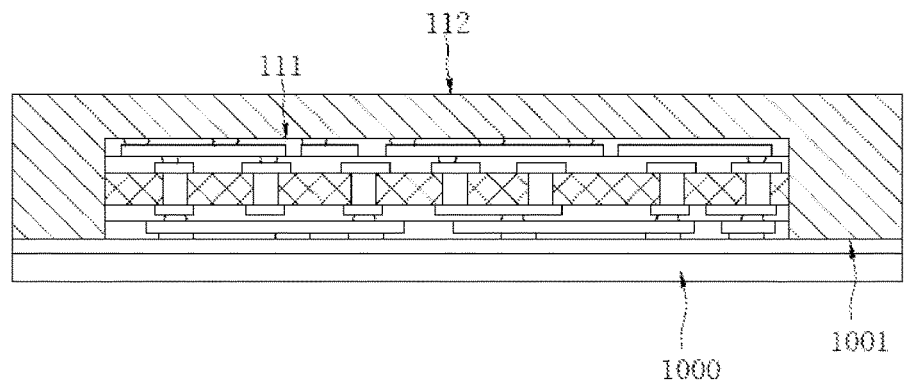
FIG. 10 is a schematic sectional view when a first plastic packaging layer is formed on the carrier board.
Figure 11:
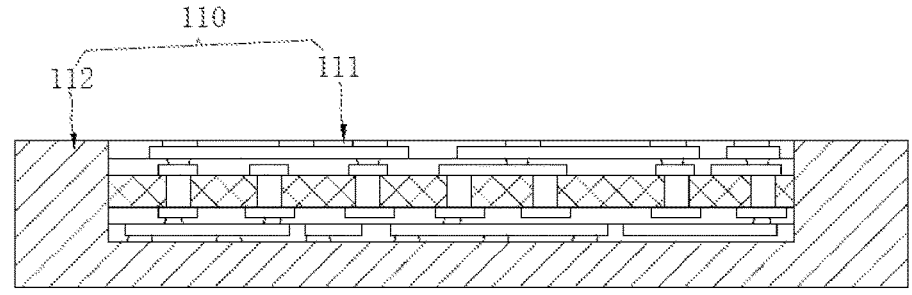
FIG. 11 is a schematic sectional view after the plastic-packaged prefabricated substrate is separated from the carrier board.

As shown in FIG. 9 to FIG. 11, the manufacturing process of forming the lower package includes the following steps.

A carrier board 1000 is provided, wherein the carrier board 1000 is provided with a temporary bonding layer 1001, such as a temporary bonding adhesive, on a surface of one side thereof, and the temporary bonding layer 1001 is provided with a plurality of prefabricated substrates 111 cut into single grains in advance (only one grain is shown in FIG. 9).

The surface of one side of the carrier board 1000 is coated with a first plastic packaging material which covers the prefabricated substrate 111 and the temporary bonding layer 1001. A first plastic packaging layer 112 is formed after the first plastic packaging material is cured.

A lower package 110 is acquired by separating both the first plastic packaging layer 112 and the prefabricated substrate 111 from the temporary bonding layer 1001 on the carrier board 1000 by using a de-bonding process.

Figure 12:
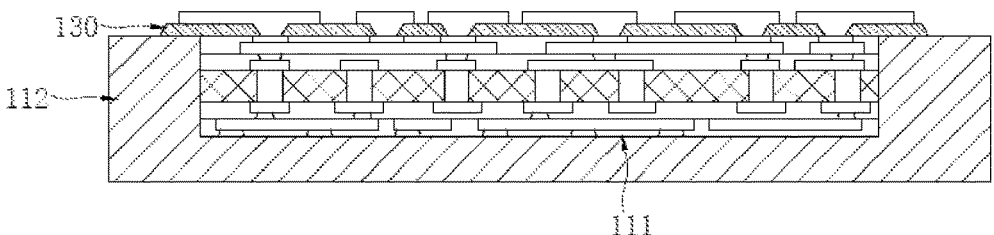
FIG. 12 is a schematic sectional view when a first redistribution stack layer is formed.

As shown in FIG. 12, a first redistribution stack layer 130 is manufactured on a surface of a side, which is not covered by the first plastic packaging material, of the lower package 110, wherein the first redistribution stack layer 130 is electrically connected to a conductive layer 1113 in the prefabricated substrate 111.

Figure 13:
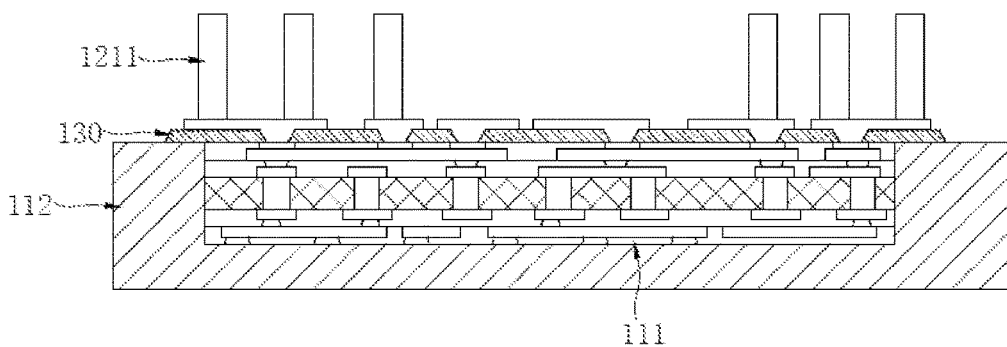
FIG. 13 is a schematic sectional view when metal conductive pillars are formed.

An upper package 120 in the packaging structure 100 is a non-prefabricated independent structure. With reference to FIG. 13 to FIG. 16, an interconnect chip layer 121 is first manufactured above the first redistribution stack layer 130. As shown in FIG. 13, a metal conductive pillar 1211 is manufactured above the first redistribution stack layer 130 and is electrically connected to the first redistribution stack layer 130.

Figure 14:
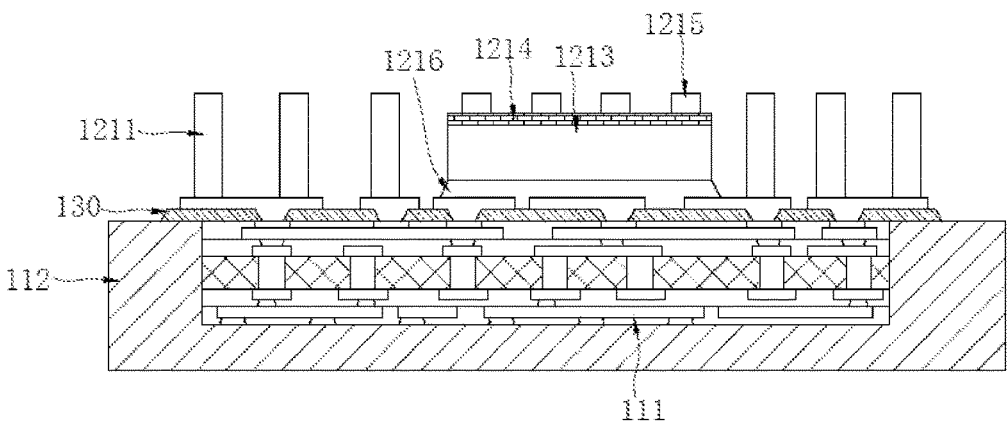
FIG. 14 is a schematic sectional view of a bonded interconnect chip.

As shown in FIG. 14, an interconnect chip 1213 is upright-bonded above the first redistribution stack layer 130 by using the adhesive layer 1216. An interconnect redistribution stack layer 1214 and a plurality of metal bumps 1215 are disposed on a surface of one side of the interconnect chip 1213 away from the first redistribution stack layer 130.

Figure 15:
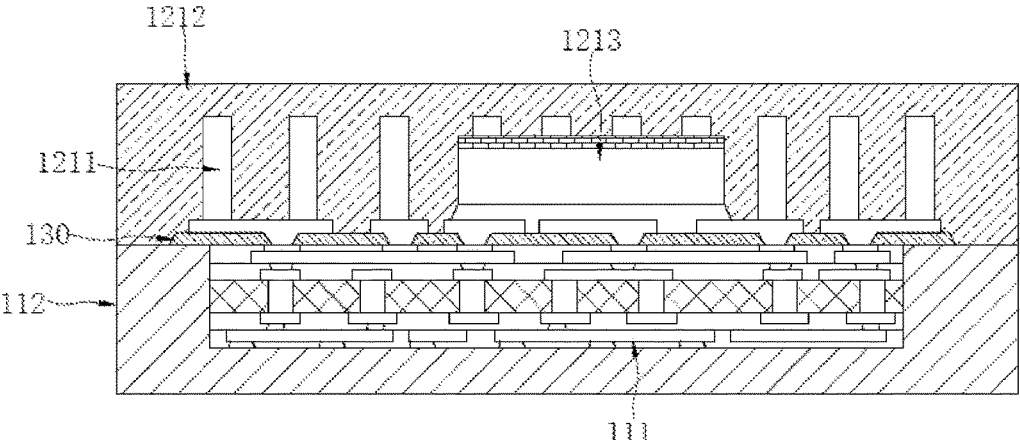
FIG. 15 is a schematic sectional view when a second plastic packaging layer is formed.

As shown in FIG. 15, a second plastic packaging material is coated above the first redistribution stack layer 130 to plastic-package a plurality of metal conductive pillars 1211 and the interconnect chip 1213 together to form a second plastic packaging layer 1212. At this time, the interconnect chip 1213 is buried in the second plastic packaging layer 1212.

Figure 16:
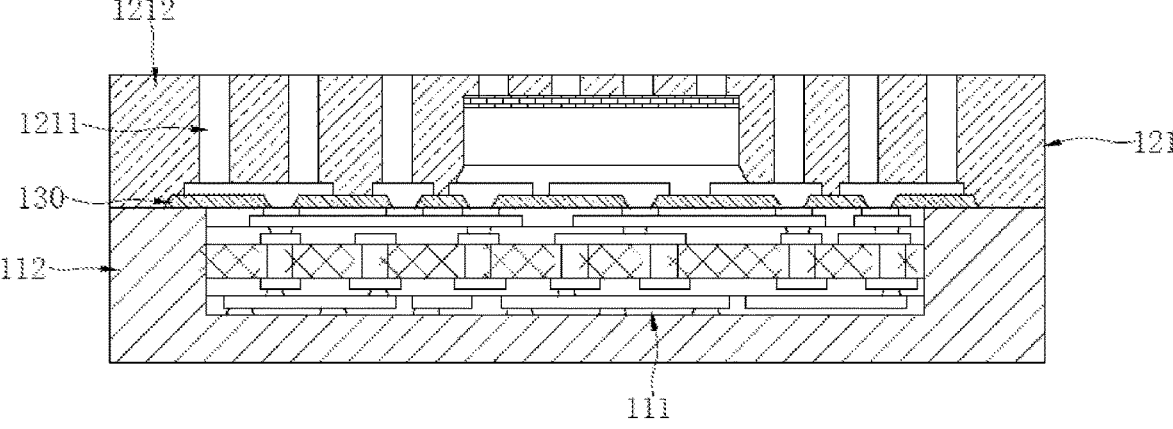
FIG. 16 is a schematic sectional view when an upper side of the second plastic packaging layer is thinned.

As shown in FIG. 16, an upper surface of the second plastic packaging layer 1212 (a side away from the first redistribution stack layer 130) is thinned, so that the plurality of metal conductive pillars 1211 and the plurality of metal bumps 1215 are exposed, and at this time the manufacturing of the interconnect chip layer 121 is completed.

Figure 17:
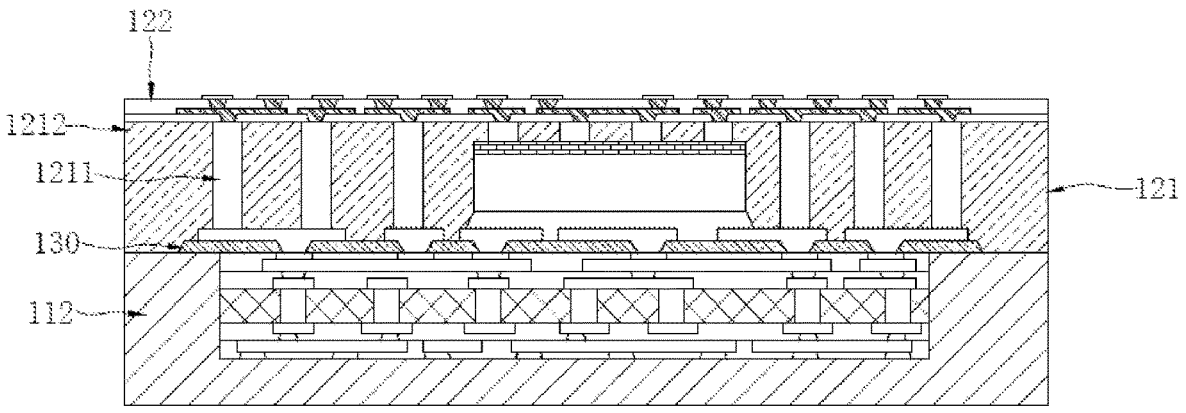
FIG. 17 is a schematic sectional view when a second redistribution stack layer is formed.

As shown in FIG. 17, a second redistribution stack layer 122 is manufactured above the interconnect chip layer 121, and the plurality of metal conductive pillars 1211 and the plurality of metal bumps 1215 are electrically connected to the second redistribution stack layer 122 respectively.

Figure 18:
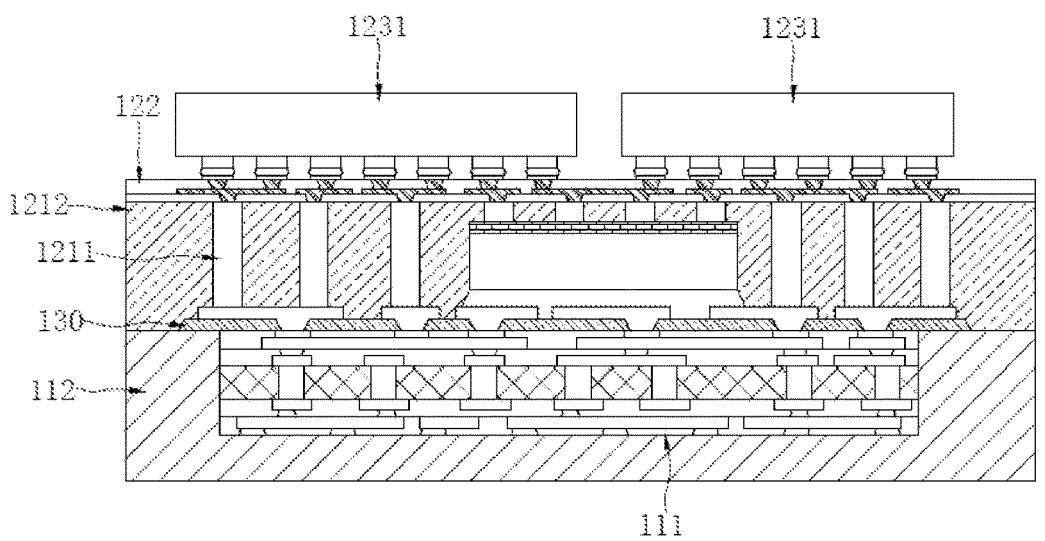
FIG. 18 is a schematic sectional view when a chip and/or a device package is flip-bonded.

As shown in FIG. 18, at least one chip 1231 and/or at least one device package 1231 are/is flip-bonded above the second redistribution stack layer 122, and the chip 1231 or the device package 1231 is electrically connected to the second redistribution stack layer 122.

Figure 19:
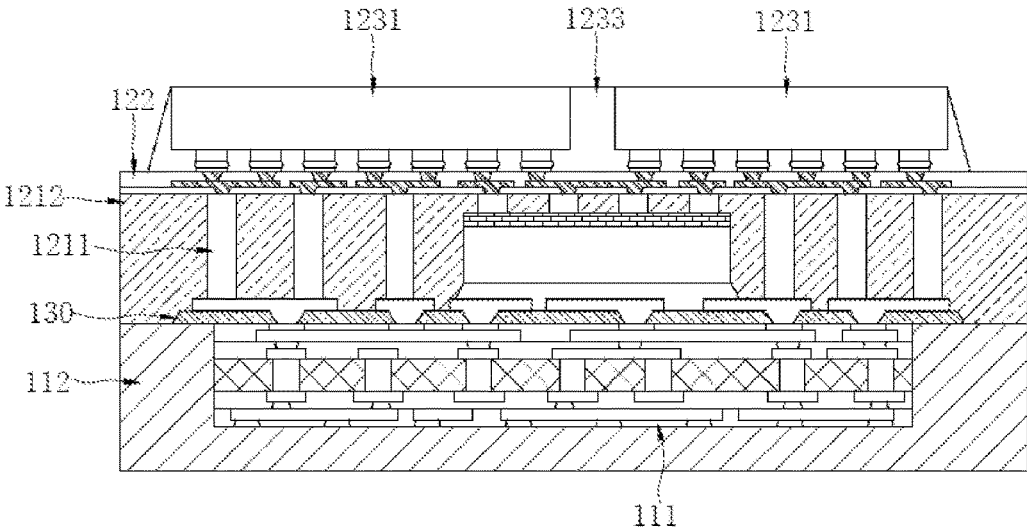
FIG. 19 is a schematic sectional view when a bottom filler is formed on the chip and/or the device package.

As shown in FIG. 19, a bottom filler layer 1233 is formed by filling a bottom filler between the second redistribution stack layer 122 and the chip 1231 or the device package 1231.

Figure 20:
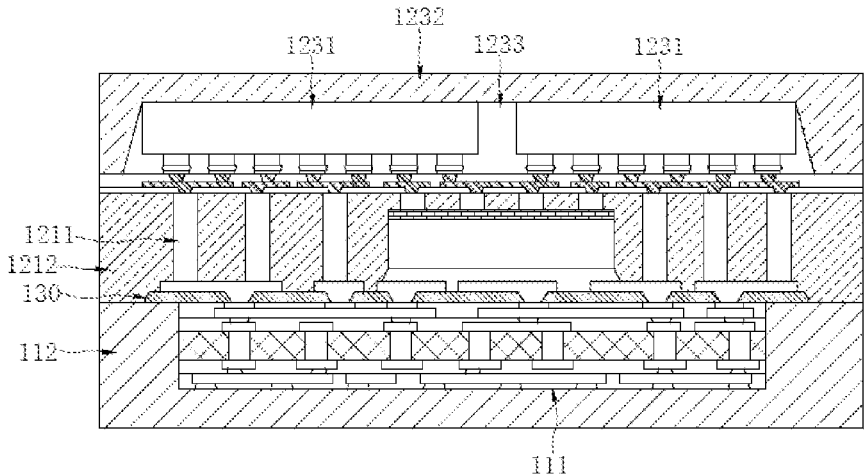
FIG. 20 is a schematic sectional view when a third plastic packaging layer is formed.

As shown in FIG. 20, a third plastic packaging material is coated above the second redistribution stack layer 122 to plastic-package the chip 1231 or the device package 1231, and a third plastic packaging layer 1232 is formed after the third plastic packaging material is cured.

Figure 21:
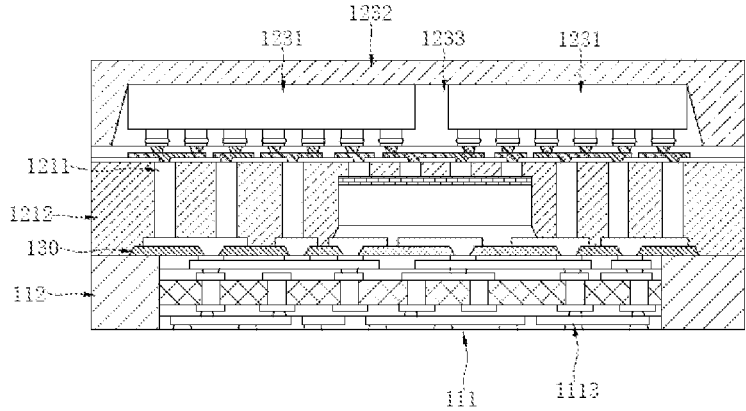
FIG. 21 is a schematic sectional view when a back side of the first plastic packaging layer is thinned to expose a metal layer in the prefabricated substrate.

As shown in FIG. 21, a side of the first plastic packaging layer 112 away from the first redistribution stack layer 130 is thinned to expose a conductive layer 1113 in the prefabricated substrate 111.

Figure 22:
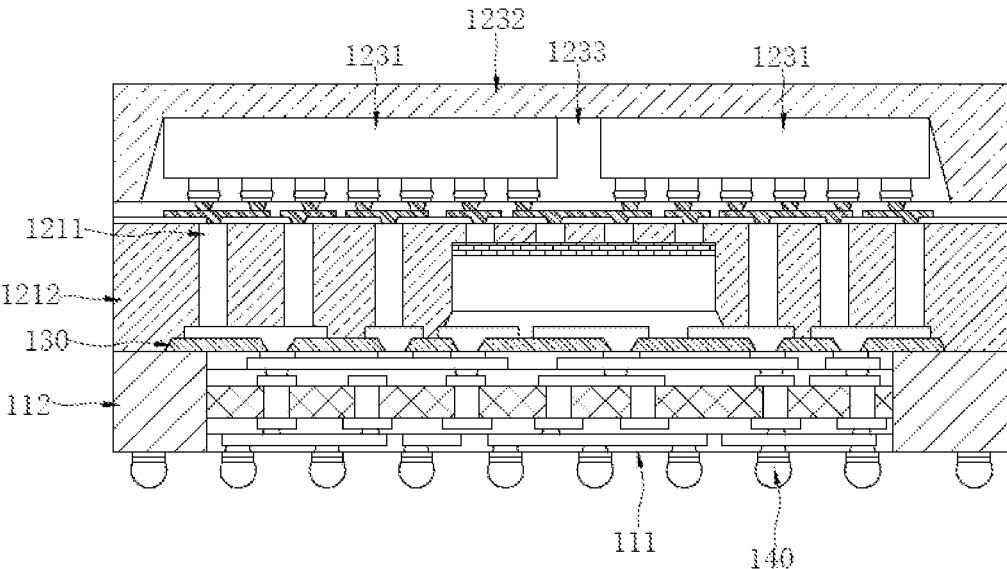
FIG. 22 is a schematic sectional view when metal bumps are formed on the metal layer.

As shown in FIG. 22, a plurality of metal bumps 140 are manufactured on the conductive layer 1113. The metal bumps 140 are, for example, metal bumps with tin caps. In other embodiments of the present invention, a plurality of solder balls (tin balls) may also be implanted on the conductive layer.

As shown in FIG. 23, an upper surface of the third plastic packaging layer 1232 (a side away from the second redistribution stack layer 122) is thinned to expose the back side of the chip 1231 or the back side of the device package 1231.

In the process of manufacturing the metal bumps 140, the chip 1231 or the device package 1231 is buried in the third plastic packaging layer 1232 to prevent the external environment from negatively affecting the chip 1231 or the device package 1231 and contribute to improvement on the yield.

In other embodiments of the present invention, when the lower package of the packaging structure includes a prefabricated substrate, a first prefabricated redistribution stack layer and/or a second prefabricated redistribution stack layer, the first prefabricated redistribution stack layer and/or the second prefabricated redistribution stack layer are/is prefabricated, for example, in wafer-level packaging, and then stacked with a prefabricated substrate, which is not cut, to form a substrate unit, the substrate unit is cut into a single-grained structure, and then plastic packaging is performed on the carrier board.

In other embodiments of the present invention, if the upper package of the packaging structure is a prefabricated independent packaging unit, after the prefabricated substrate is plastic-packaged and the first redistribution stack layer is manufactured, the upper package is directly flip-bonded to the first redistribution stack layer to acquire the corresponding packaging structure.

In the packaging structure and the manufacturing method thereof according to the present invention, the lower package of the packaging structure includes the prefabricated substrate and the first redistribution stack layer is disposed above the prefabricated substrate and has the minimum line width/line spacing less than that of the prefabricated substrate, so that more chips and/or device packages are integrated in the packaging structure by using the first redistribution stack layer having the smaller line width/line spacing. In addition, the upper package of the packaging structure includes the metal conductive pillars for vertical interconnection, the second plastic packaging layer and the second redistribution stack layer, wherein the second plastic packaging layer plastic-packages the metal conductive pillars, the second redistribution stack layer is disposed above the second plastic packaging layer, the first redistribution stack layer and the second redistribution stack layer are vertically interconnected through the metal conductive pillars, and a capacitor and an inductor formed between the first redistribution stack layer and the second redistribution stack layer which are spaced apart vertically can serve as filters or electrostatic protection structures.

The present invention has been described by the above related embodiments, but the above embodiments are only examples of implementing the present invention. In addition, the technical features involved in the different embodiments of the present disclosure described above may be combined with one another as long as they do not conflict with one another. It must be pointed out that the present invention may also have many other embodiments. Without departing from the spirit and essence of the present invention, those skilled in the art may make various corresponding changes and variants according to the present invention, but these corresponding changes and variants should belong to the protection scope of the appended claims of the present invention.

What is claimed is:

1. A packaging structure, comprising:
a lower package, an upper package disposed above the lower package, and a first redistribution stack layer disposed between the lower package and the upper package, wherein the first redistribution stack layer is electrically connected to the lower package and the upper package;
the lower package comprises a prefabricated substrate and a first plastic packaging layer surrounding the periphery of the prefabricated substrate; and
a minimum line width/line spacing of the first redistribution stack layer is less than a minimum line width/line spacing of the prefabricated substrate.

2. The packaging structure according to claim 1, wherein the upper package comprises an interconnect chip packaging layer disposed above the first redistribution stack layer, a second redistribution stack layer disposed above the interconnect chip packaging layer, and a packaging layer with a chip and/or a device package, which is disposed above the second redistribution stack layer, wherein
the interconnect chip packaging layer comprises a plurality of metal conductive pillars and a second plastic packaging layer which plastic-packages the plurality of metal conductive pillars above the first redistribution stack layer, and the first redistribution stack layer and the second redistribution stack layer are electrically connected through the plurality of metal conductive pillars; and
the interconnect chip packaging layer further comprises an interconnect chip buried in the second plastic packaging layer, and the interconnect chip is upright-bonded above the first redistribution stack layer; and an interconnect redistribution stack layer is disposed on a surface of a side, facing the second redistribution stack layer, of the interconnect chip, a minimum line width/line spacing of the interconnect redistribution stack layer is less than 2 μm, and the interconnect redistribution stack layer comprises at least one capacitor.

3. The packaging structure according to claim 2, wherein both the minimum line width/line spacing of the first redistribution stack layer and a minimum line width/line spacing of a second redistribution stack layer are less than 10 μm.

4. The packaging structure according to claim 2, wherein in the packaging layer with the chip and/or the device package, the chip and/or the device package are/is flip-bonded above the second redistribution stack layer and is electrically connected to the second redistribution stack layer; the packaging layer with the chip and/or the device package further comprises a third plastic packaging layer which plastic-packages the chip and/or the device package above the second redistribution stack layer; and a back surface of the chip and/or a back surface of the device package are exposed from the third plastic packaging layer respectively.

5. The packaging structure according to claim 2, further comprising: at least one first silicon capacitor chip and/or at least one second silicon capacitor chip, wherein
the at least one first silicon capacitor chip is buried in a first base material layer of the prefabricated substrate, and is electrically connected to the first redistribution stack layer directly; and
the at least one second silicon capacitor chip is buried in the second plastic packaging layer, and is electrically connected to the first redistribution stack layer or the second redistribution stack layer directly.

6. The packaging structure according to claim 1, wherein a plurality of metal bumps or solder balls are further disposed on a back side of the prefabricated substrate away from the first redistribution stack layer, the plurality of metal bumps or solder balls being electrically connected to a conductive layer in the prefabricated substrate.

7. The packaging structure according to claim 1, wherein the lower package further comprises:
a first prefabricated redistribution stack layer and/or a second prefabricated redistribution stack layer; the prefabricated substrate comprises a first surface and a second surface which are opposite to each other, the first prefabricated redistribution stack layer being disposed on one side of the first surface and the second prefabricated redistribution stack layer being disposed on one side of the second surface;
the first plastic packaging layer is disposed around the periphery of the first prefabricated redistribution stack layer and/or the second prefabricated redistribution stack layer that forms a substrate unit with the prefabricated substrate; and both a minimum line width/line spacing of the first prefabricated redistribution stack layer and a minimum line width/line spacing of the second prefabricated redistribution stack layer are less than 10 μm.

8. The packaging structure according to claim 1, further comprising a passive element which is buried in the first plastic packaging layer and is electrically connected to the first redistribution stack layer.

9. The packaging structure according to claim 1, further comprising a heat dissipation device disposed on an edge and/or at a corner of the first redistribution stack layer.

10. The packaging structure according to claim 1, wherein the lower package further comprises:

a third prefabricated redistribution stack layer and a prefabricated interconnect chip packaging layer which are disposed between the prefabricated substrate and the first redistribution stack layer, wherein the third prefabricated redistribution stack layer is disposed above the prefabricated substrate, and the prefabricated interconnect chip packaging layer is disposed above the third prefabricated redistribution stack layer;

the prefabricated interconnect chip packaging layer comprises a plurality of prefabricated metal conductive pillars, a prefabricated interconnect chip, and a fourth plastic packaging layer which plastic-packages the plurality of prefabricated metal conductive pillars and the prefabricated interconnect chip above the third prefabricated redistribution stack layer; the first redistribution stack layer and the third prefabricated redistribution stack layer are electrically connected through the plurality of prefabricated metal conductive pillars; and the prefabricated substrate, the first plastic packaging layer, the third prefabricated redistribution stack layer, the prefabricated interconnect chip packaging layer and the first redistribution stack layer together constitute a prefabricated packaging substrate.

11. A manufacturing method of a packaging structure according to claim 1, comprising:

forming a lower package by providing a prefabricated substrate and plastic-packaging the prefabricated substrate to form a first plastic packaging layer;

forming a first redistribution stack layer on one side of the lower package, wherein the first redistribution stack layer and the prefabricated substrate are electrically connected; and acquiring the packaging structure by packaging an upper package above the first redistribution stack layer, wherein a minimum line width/line spacing of the first redistribution stack layer is less than a minimum line width/line spacing of the prefabricated substrate.

12. A manufacturing method of a packaging structure according to claim 1, wherein the step of forming the lower package by providing the prefabricated substrate and plastic-packaging the prefabricated substrate to form the first plastic packaging layer comprises:

providing a carrier board which is temporarily bonded to a plurality of prefabricated substrates that are cut into single grains in advance;

forming the first plastic packaging layer by coating the carrier board with a plastic packaging material to plastic-package the prefabricated substrate; and acquiring the lower package by separating the first plastic packaging layer and the prefabricated substrate from the carrier board.

13. The manufacturing method according to claim 12, wherein the step of acquiring the packaging structure by packaging the upper package above the first redistribution stack layer comprises:

forming a plurality of metal conductive pillars above the first redistribution stack layer;

bonding an interconnect chip above the first redistribution stack layer, wherein an upper portion of the interconnect chip away from the first redistribution stack layer is provided with an interconnect redistribution stack layer and a plurality of conductive bumps;

forming a second plastic packaging layer by plastic-packaging the plurality of metal conductive pillars and the interconnect chip;

thinning the second plastic packaging layer to expose the plurality of metal conductive pillars and the plurality of conductive bumps;

forming a second redistribution stack layer above the second plastic packaging layer, wherein the second redistribution stack layer is electrically connected to the plurality of metal conductive pillars and the plurality of conductive bumps;

flip-bonding a chip and/or a device package above the second redistribution stack layer; and forming a third plastic packaging layer by plastic-packaging the chip and/or the device package.

14. The manufacturing method of the packaging structure according to claim 13, further comprising:

thinning a side of the first plastic packaging layer away from the first redistribution stack layer to expose a conductive layer on a back side of the prefabricated substrate;

implanting solder balls or metal bumps onto the conductive layer, wherein the solder balls or metal bumps are electrically connected to the conductive layer; and thinning the third plastic packaging layer to expose a back side of the chip and/or a back side of the device package.

* * * * *